(12) United States Patent
Breynaert et al.

(10) Patent No.: US 11,496,080 B2
(45) Date of Patent: Nov. 8, 2022

(54) RIPPLE COUNT CIRCUIT INCLUDING VARYING RIPPLE THRESHOLD DETECTION

(71) Applicant: INTEVA PRODUCTS FRANCE SAS, Sully sur Loire (FR)

(72) Inventors: François Breynaert, Caen (FR); Simon Herpin, Ferolles (FR)

(73) Assignee: INTEVA FRANCE, Sully-sur-Loire (FR)

( * ) Notice: Subject to any disclaimer, the term of this patent is extended or adjusted under 35 U.S.C. 154(b) by 130 days.

(21) Appl. No.: 16/960,414

(22) PCT Filed: Jan. 9, 2019

(86) PCT No.: PCT/EP2019/050393
§ 371 (c)(1),
(2) Date: Jul. 7, 2020

(87) PCT Pub. No.: WO2019/137933
PCT Pub. Date: Jul. 18, 2019

(65) Prior Publication Data
US 2020/0343842 A1    Oct. 29, 2020

(30) Foreign Application Priority Data

Jan. 9, 2018 (FR) ..................................... 18/50170

(51) Int. Cl.
*H02P 7/00* (2016.01)
*H02P 7/285* (2016.01)
*H03K 23/58* (2006.01)

(52) U.S. Cl.
CPC .......... *H02P 7/0094* (2013.01); *H02P 7/2855* (2013.01); *H03K 23/58* (2013.01)

(58) Field of Classification Search
CPC ...... H02P 7/0094; H02P 7/2855; H03K 23/58
See application file for complete search history.

(56) References Cited

U.S. PATENT DOCUMENTS 4,707,650 A    11/1987 Bose
4,924,166 A     5/1990 Roussel
(Continued)

FOREIGN PATENT DOCUMENTS

EP    0333572 A1    9/1989
FR    3030152 A1    6/2016

OTHER PUBLICATIONS

International Search Report and Written Opinion for International Application No. PCT/EP2019/050393; Application Filing Date Jan. 9, 2019; dated Apr. 25, 2019 (17 pages).

*Primary Examiner* — Zoheb S Imtiaz
(74) *Attorney, Agent, or Firm* — Cantor Colburn LLP

(57) ABSTRACT

A motor control system includes a variable voltage supply in signal communication with a direct current (DC) motor. The DC motor includes a rotor induced to rotate in response to a drive current generated by a variable supply voltage delivered by the voltage supply. The rotation of the rotor (103) generates a mechanical force that drives a component. A ripple count circuit (104) is configured to filter the drive current based on a rotational speed (ω) of the rotor (103) to generate a filtered drive current signal, and to generate a varying threshold based on the filtered drive current signal. Based on a comparison between the filtered drive current signal and the varying threshold, the ripple count circuit (104) generates a pulsed output signal indicative of the rotational speed (ω) of the rotor and a rotational position (θ) of the rotor.

12 Claims, 9 Drawing Sheets

(56) References Cited

U.S. PATENT DOCUMENTS 10,263,551 B2     4/2019   Tisserand et al.
2017/0346428 A1*   11/2017   Tisserand ................ H02P 9/305

* cited by examiner

RIPPLE COUNT CIRCUIT INCLUDING VARYING RIPPLE THRESHOLD DETECTION

CROSS-REFERENCE

This application is a National Stage of International Application No. PCT/EP2019/050393, filed Jan. 9, 2019, which claims benefit of French Application No. 18/50170, filed Jan. 9, 2018, the disclosures of which are incorporated by reference herein in their entirety.

TECHNICAL FIELD

Exemplary embodiments of the present disclosure are related to direct current (DC) motors, and more particularly, to DC motors for operating electrically operated automotive components.

BACKGROUND

Automobile vehicles are increasingly equipped with electrically operated components. For example, vehicles typically include sliding roofs, window glass regulators, or rear view mirrors driven by electric DC motors. Information indicating the rotor speed of the motor can be utilized to determine a position of the component (e.g., the window). Conventional position measurement systems utilize a sensor in conjunction with a magnetic ring to determine the rotor speed of the motor. For example, a Hall Effect Sensor (HES) detects movements of a magnetic ring integrated with the rotor. The magnet ring generates a magnetic flux of varying strength towards the HES depending on the relative axial position of the magnetic ring and sensor. The magnetic flux induces a current, and variations in magnetic flux result in variations in the induced currents. Accordingly, the frequency of the current measured by the HES is indicative of the rotor speed of the DC motor.

Other positional measurement systems have attempted to utilize a speed-proportional signal in order to determine a position of an adjustment device of a motor vehicle. However, these attempts have required the implementation of highly expensive controllers such as Field Programmable Gate Arrays (FPGAs), for example, to execute the computations necessary to obtain the targeted ripple currents. In other attempts, the entire motor assembly has been structurally modified with the goal of generating a normalize ripple pattern that eliminates ripple errors and signal noise. Modifying the motor assembly, however, has proven to be overly expensive and results in limitations to the motor's overall performance.

SUMMARY OF THE INVENTION

A motor control system includes a variable voltage supply in signal communication with a direct current (DC) motor. The DC motor includes a rotor induced to rotate in response to a drive current generated by a variable supply voltage delivered by the voltage supply. The rotation of the rotor 103 generates a mechanical force that drives a component. A ripple count circuit 104 is configured to filter the drive current based on a rotational speed (ω) of the rotor 103 to generate a filtered drive current signal, and to generate a varying threshold based on the filtered drive current signal. Based on a comparison between the filtered drive current signal and the varying threshold, the ripple count circuit 104 generates a pulsed output signal indicative of the rotational speed (ω) of the rotor and a rotational position (θ) of the rotor.

According to another non-limiting embodiment, a ripple count circuit comprises an amplifier configured to amplify a drive current that drives rotation of a rotor included in a direct current (DC) motor, and a current differential circuit configured generate a derivative current signal that indicates an instantaneous rate of current change (d(i)/dt) of the drive current. A bandwidth filter is configured to filter the derivative current signal based on a rotational speed (ω) of the rotor so as to output a first filtered signal. A downstream low pass filter is configured to filter the first filtered signal based on the rotational speed (ω) of the rotor so as to output a second filtered signal that eliminates harmonics from the first filtered signal. The ripple count circuit further includes a variable threshold unit configured to generate a varying threshold signal based on the second filtered signal. A comparator circuit is configured to compare the second filtered signal to the varying threshold. The comparator circuit generates a pulsed output signal having a first output voltage level when a voltage level of the filter drive current is greater than or equal to the varying threshold signal, and a second output voltage level when a voltage level of the filter drive current is less than the varying threshold signal. The pulsed output signal indicates the rotational speed (ω) of the rotor and a rotational position (θ) of the rotor.

According to yet another non-limiting embodiment, a method is provided to determine a rotor speed of a direct current (DC) motor. The method comprises generating a variable supply voltage, inducing a drive current based on the variable supply voltage, and rotating a rotor included in the DC motor based on the drive current. The method further comprises generating a mechanical force in response to rotating the rotor to drive a component. The method further comprises filtering the drive current based on a rotational speed of the rotor to generate at least one filtered drive current signal, and generating a varying threshold signal based on the at least one filtered drive current signal. The method further comprises generating a pulsed output signal indicative of the rotational speed (ω) of the rotor and a rotational position (θ) of the rotor based on a comparison between the at least one filtered drive current signal and the varying threshold signal.

The above-described and other features and advantages of the present invention will be appreciated and understood by those skilled in the art from the following detailed description, drawings, and appended claims.

BRIEF DESCRIPTION OF THE DRAWINGS

Embodiments of the present invention will now be described, by way of example only, with reference to the accompanying drawings in which.

DETAILED DESCRIPTION

Figure 1:
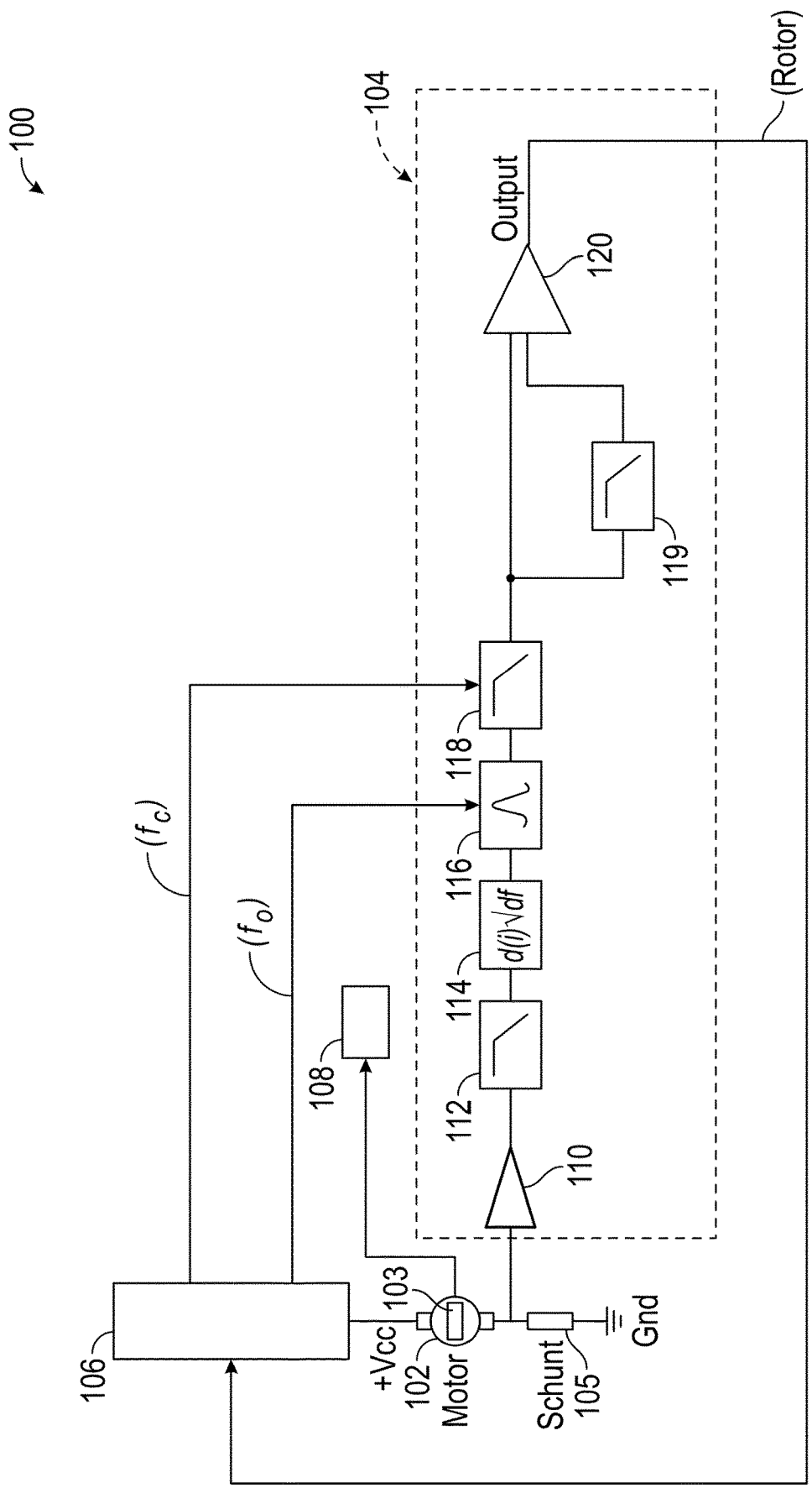
FIG. 1 is a schematic diagram of a motor control system including a ripple count circuit according to a non-limiting embodiment.

Conventional DC motor position systems utilizing a HES and a magnetic ring are expensive and complex. In addition, the frequency of the measured flux must be further computed thereby extending the time needed to determine the corresponding rotor speed. Attempts to overcome the disadvantages of the HES and magnetic ring have led to the utilization of highly expensive digital controllers that perform complex algorithms such as a fast Fourier transform, for example, to calculate the rotor speed based on the electrical current driving the DC motor.

Various non-limiting embodiments described herein provide a ripple count circuit configured to determine a rotor speed of a DC motor based on a residual ripple current. During operation of the DC motor, a stationary energy unit, sometimes referred to as a stator or field winding, is energized with electrical current. The current flowing through the field winding generates a magnetic field that induces rotation of a rotor, sometimes referred to as a rotating armature. The armature current signal generated in response to the rotation includes a DC signal component and an alternating current (AC) signal component superimposed on the DC signal component. The ripple count circuit according to one or more embodiments described herein is configured to extract the AC signal from the armature current signal without the use of an expensive controller or a combination of a magnetic ring and HES as required by conventional DC motor position systems. The extracted AC signal can then be utilized to generate a pulsed signal or square-wave, which indicates the actual rotational speed and the actual rotational position of the rotor.

There may be some scenarios where it may be difficult to determine the precise positional information of the component (e.g., a position of an automotive window) when utilizing a fixed threshold to generate the pulsed signal or square-wave. For example, it may be difficult to count the number of pulses in the pulsed ripple count signal, and therefore, may be difficult to determine a precise rotational speed of the motor rotor. Some load conditions applied to the motor, for instance, can generate current fluctuations that generate noise pulses. These noise pulses can be mistaken for ripple pulses associated with the ripple current of the motor, thereby decreasing the integrity and accuracy of the pulsed ripple count signal. In other instances, the current pulses may drift from the fixed threshold such that they are not detected.

To improve the precision of pulsed ripple count signal, at least one non-limiting embodiment described herein provides a ripple count circuit configured to determine a rotor speed of a DC motor based on a varying threshold, referred to herein as a varying ripple threshold. Unlike a fixed threshold, the varying ripple threshold ensures that the extracted AC signal remains within the varying threshold range. In this manner, the accuracy and integrity of the pulsed ripple count signal is improved when compared to a ripple count circuit that utilizes a fixed threshold.

Referring now to FIG. 1, a motor control system 100 is illustrated according to a non-limiting embodiment. The motor control system 100 includes a motor 102 and a ripple count circuit 104. The motor 102 includes a DC motor 102, which is in signal communication with a power supply 106. The power supply 106 can include, for example, an electronic hardware controller 106 which outputs a variable supply voltage (+Vcc).

The DC motor 102 includes a rotor 103 induced to rotate in response to a drive current generated by the variable supply voltage (+Vcc). The rotation of the rotor 103 generates a mechanical force that drives a component 108. Going forward, the component 108 will be described in terms of an automotive vehicle window regulator unit 108. It should be appreciated, however, that other components 108 can be driven by the DC motor 102 including, but not limited to, a sliding roof, rear view mirrors, etc. In terms of a window glass regulating unit 108, the DC motor 102 can drive various mechanical components to vary the position of a glass window (e.g., move the window up or down). The input supply voltage (+Vcc) can be actively controlled to vary the voltage level applied to the DC motor 102, thereby adjusting the speed of the rotor 103, and thus the speed at which to move the glass window. A shunt resistor 105 can be connected to the output terminal of the motor 102 to measure AC or DC electrical drive current based on the voltage drop the drive current produces across the resistor 105.

The ripple count circuit 104 includes an amplifier 110, a low pass filter 112, a current differential circuit 114, a bandwidth filter 116, a downstream low pass filter 118, a variable threshold unit 119, and a comparator circuit 120. The ripple count circuit 104 is configured to filter the drive current based on the rotational speed (ω) of the rotor 103, and to generate a pulsed output signal indicative of the actual rotational speed (ω) and an actual rotational position (θ) of the rotor 103. In addition, the ripple count circuit 104 is configured to generate a varying threshold signal based on the filtered drive current signal, and to generate the pulsed output signal indicative of the rotational speed (ω) of the rotor 103 and a rotational position (θ) of the rotor 103 based on a comparison between the filtered drive current signal and the varying threshold signal.

Figure 2:
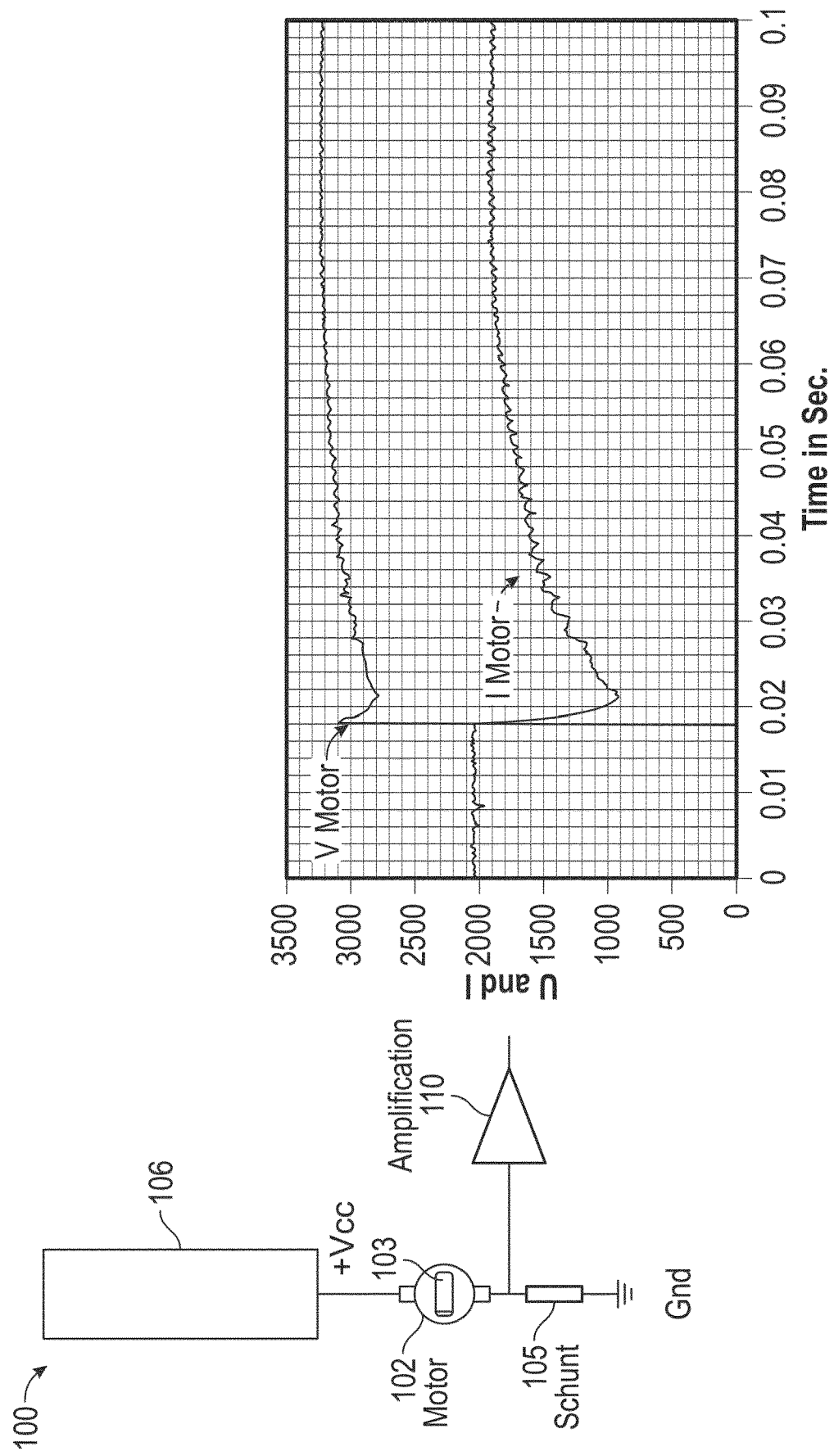
FIG. 2 is a signal diagram illustrating the output of an amplification stage included in the ripple count circuit of FIG. 1 according to a non-limiting embodiment.

The amplifier 110 includes an input that is connected in common with the output terminal of the motor 102 and the input terminal of the shunt resistor 105. Various amplifiers can be used including, but not limited to, an operation amplifier circuit (Op-Amp). In this manner, the amplifier 110 receives the drive current and generates an amplified drive current signal ($I_{MOTOR}$) as illustrated in FIG. 2.

Figure 3:
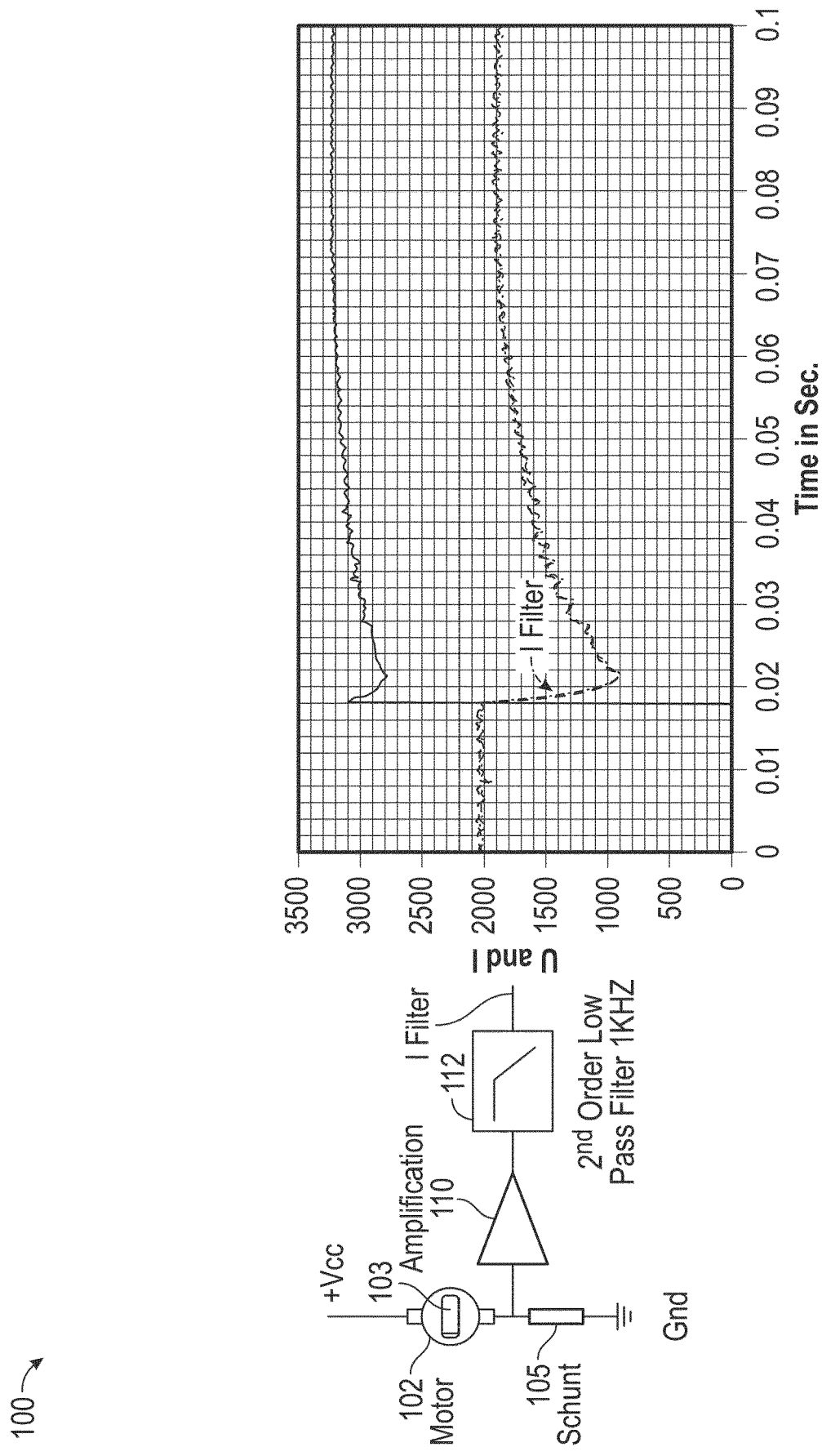
FIG. 3 is a signal diagram illustrating the output of a low pass filter stage included in the ripple count circuit of FIG. 1 according to a non-limiting embodiment.

The low pass filter 112 includes an input terminal that is connected to the output of the amplifier 110 to receive the amplified drive current signal ($I_{MOTOR}$). The low pass filter 112 can be constructed as a second-order low pass filter having a frequency cutoff set, for example, at about 1 kilohertz (1 KHz). Accordingly, the low pass filter 112 outputs a smoothened or filtered drive current signal ($I_{FILTER}$) as illustrated in FIG. 3.

The current differential circuit 114 includes an input that is connected to the output terminal of the low pass filter 112 to receive the filtered drive current signal ($I_{FILTER}$). The current differential circuit 114 can be constructed as an inductor, for example. Accordingly, the output of the current differential circuit 114 (e.g., the inductor) determines the derivative of the filtered drive current signal, i.e., $I_{FILTER}'$, which indicates the instantaneous rate of current change (d(i)/dt)) having measured units of amps per second.

The bandwidth filter 116 includes an input that is connected to the output terminal of the current differential circuit 114 to receive $I_{FILTER}'$. The bandwidth filter 116 can be constructed as any variable center frequency bandwidth filter capable of actively varying its center frequency ($f_O$). In at least one embodiment, the controller 106 generates a center frequency control signal indicative of the center frequency ($f_O$), and the bandwidth filter 116 is a digital bandwidth filter that actively varies its center frequency ($f_O$) based on the center frequency control signal output from the controller 106.

Figure 4:
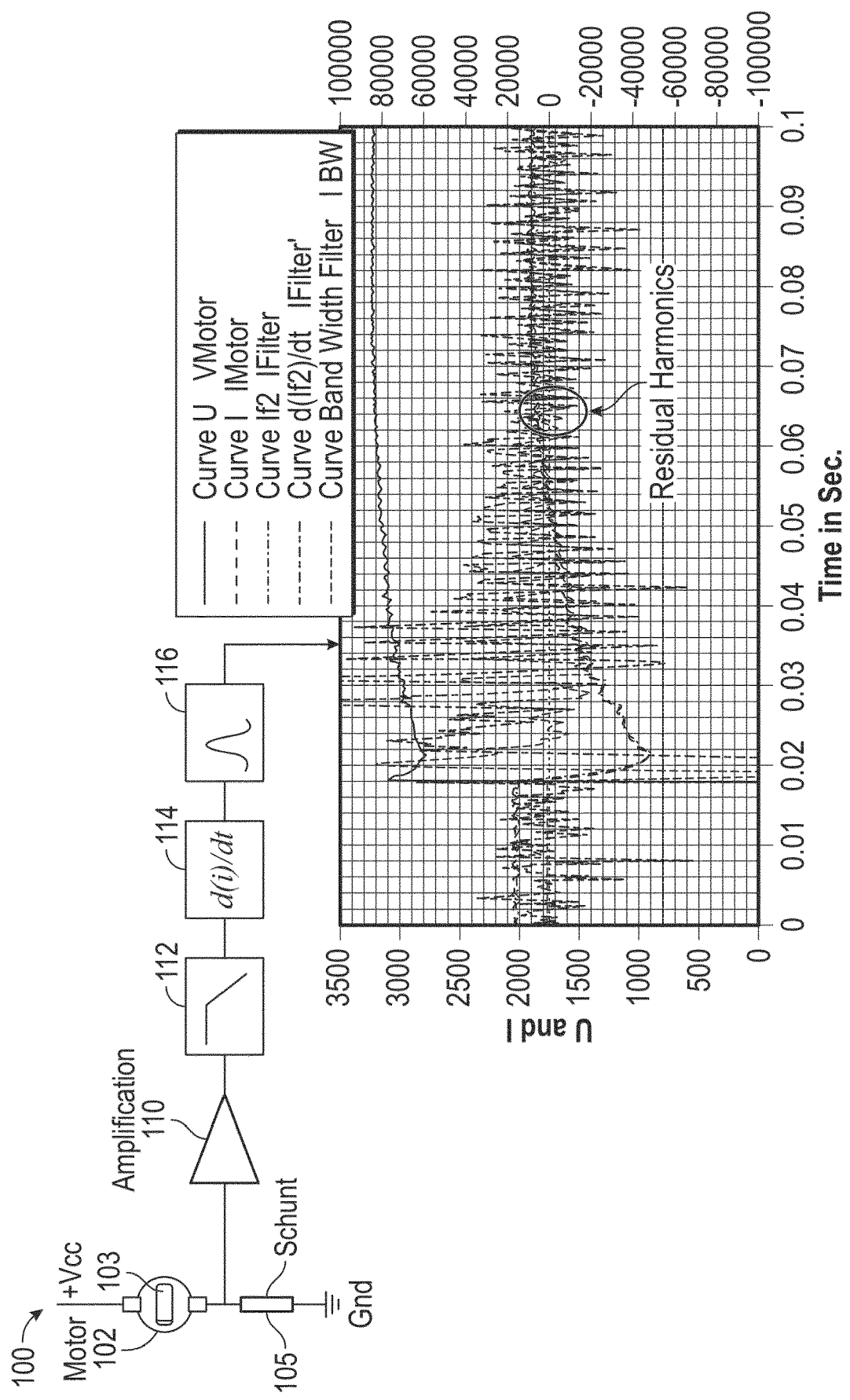
FIG. 4 is a signal diagram illustrating the output of a bandwidth filter stage included in the ripple count circuit of FIG. 1 according to a non-limiting embodiment.

The bandwidth filter 116 filters $I_{FILTER}'$ according to a bandwidth having a center frequency ($f_O$) that is dynamically (i.e., actively) set according to an estimated rotational speed (ω) of the rotor 103. Thus, the center frequency ($f_O$) of the bandwidth filter 116 is dynamically adjusted or varied as the rotor speed (ω) changes. Accordingly, the bandwidth filter 116 outputs a bandwidth filtered signal ($I_{BW}$) as illustrated in FIG. 4. In at least one embodiment, the present rotational speed (ω) of the rotor 103 can be estimated based on the measured voltage of the motor 102 and the measured current of the motor 102. For example, each time the motor 102 is powered, the starting voltage ($U_a$) and the starting current ($I_a$) can be measured, and while operating, the motor voltage ($U_m$) and motor Current ($I_m$) can also be measured. The measurements can be performed by the controller 106 and/or various sensors installed on the motor 102. The motor internal resistance, i.e., $$R_i = \frac{U_a}{I_a},$$

can be calculated, e.g., by the controller 106, while the magnetic flux (Φ) of the motor 102, the number of winding turns (n) of the motor 102, and the number of motor slots ($S_m$) of the motor 102 are known constants. The inductance value (L) of the motor 102, and the motor constant (K) are also known constants. Therefore, the estimated rotor speed (ω) can be calculated as:

$$\omega = \frac{U_m - R_i \times I_m - L\frac{d(I_m)}{dt}}{K \times n \times \Phi} \qquad \text{eq. 1}$$

In turn, the bandwidth filter center frequency ($f_O$) can be calculated, e.g., by the controller 106, as:

$$f_O = \frac{\omega}{2\pi \times S_m} \qquad \text{eq. 2}$$

The downstream low pass filter 118, includes an input terminal that is connected to the output of the bandwidth filter 116 to receive the bandwidth filtered signal ($I_{BW}$). The downstream low pass filter 118 can operate according to a dynamically varying frequency cutoff ($f_C$). The downstream low pass filter 118 can be constructed as any active low pass filter capable of actively varying its frequency cutoff ($f_C$). In at least one embodiment, the controller 106 outputs a frequency cutoff control signal that indicates the ($f_C$), and the downstream low pass filter 118 is a digital low pass filter that actively varies its frequency cutoff ($f_C$) based on a frequency cutoff control signal output from the controller 106.

The frequency cutoff ($f_C$) can be dynamically (i.e., actively) set according to the estimated rotational speed (ω) of the rotor 103. Based on the estimated rotational speed (ω) described above, the frequency cutoff ($f_C$) can be calculated, e.g., by the controller 106, as:

$$f_c = \frac{\omega}{2\pi} \qquad \text{eq. 3}$$

Figure 5:
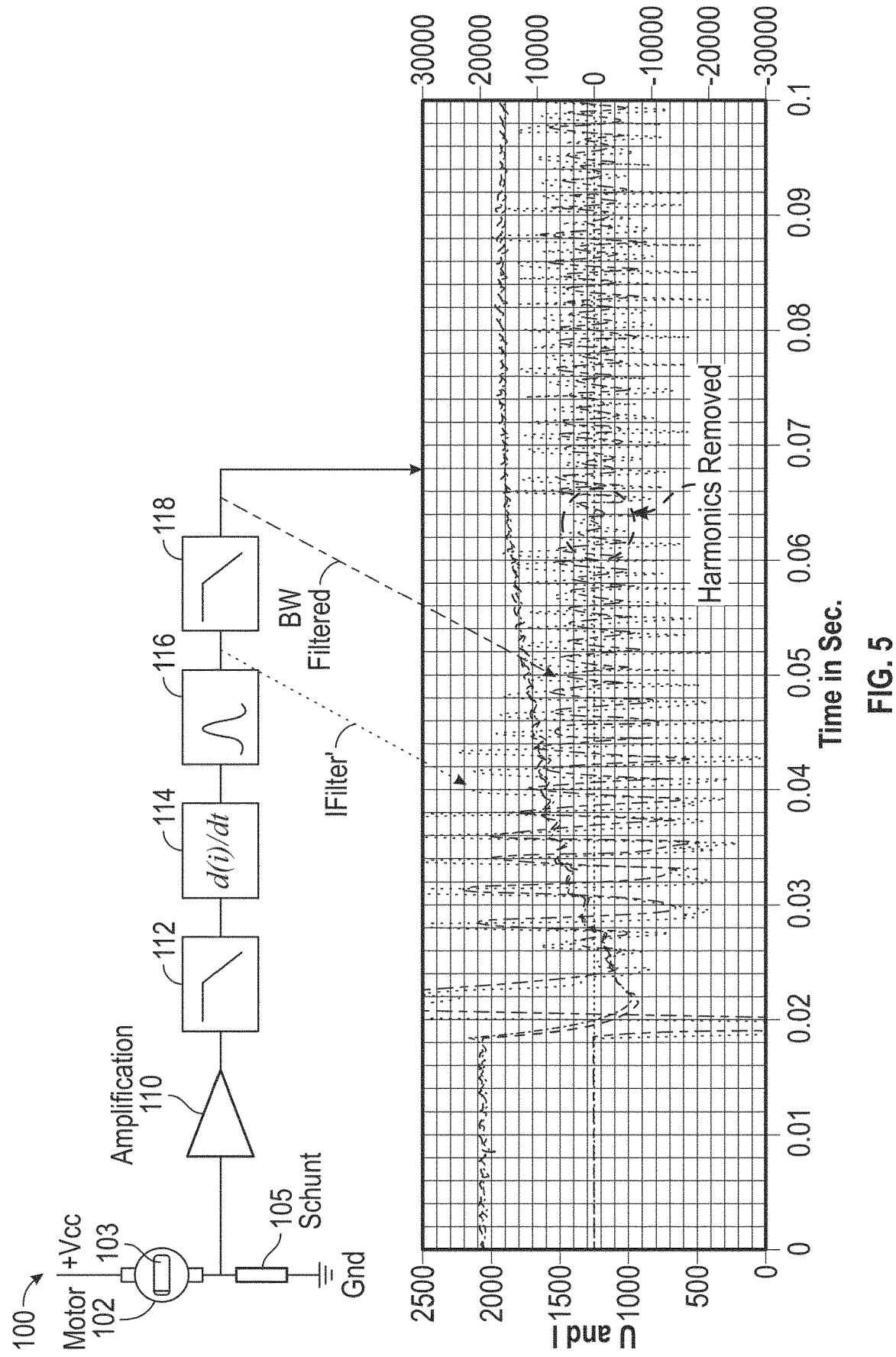
FIG. 5 is a signal diagram illustrating the output of a downstream low pass filter stage located downstream from the bandwidth filter stage included in the ripple count circuit of FIG. 1 according to a non-limiting embodiment.

Accordingly, the downstream low pass filter 118 generates a filtered AC bandwidth signal ($BW_{FILTERED}$) shown in FIG. 5, which removes the remaining harmonics previously found in the initial bandwidth signal (see FIG. 4).

The variable threshold unit 119 is configured to generate a varying ripple threshold ($THR_{RIPPLE}$) which is compared to the filtered AC bandwidth signal ($BW_{FILTERED}$) generated by the downstream low pass filter 118. Unlike a fixed threshold, which is maintained at a fixed threshold value regardless as to the state of a compared output signal (e.g., the downstream low pass filter 118), the varying ripple threshold ($THR_{RIPPLE}$) varies based on the state of the AC bandwidth signal ($BW_{FILTERED}$).

The variable threshold unit 119 includes an input terminal connected to the output terminal of the 118 to receive the AC bandwidth signal ($BW_{FILTERED}$), and an output terminal that outputs the varying ripple threshold ($THR_{RIPPLE}$). In one or more non-limiting embodiments, the variable threshold unit 119 is constructed as a phase shifting circuit. For example, the variable threshold unit 119 can be constructed as a phase-shifting transformer which receives the AC bandwidth signal ($BW_{FILTERED}$), and outputs the varying ripple threshold ($THR_{RIPPLE}$) being phase-shifted with respect to the phase of the input AC bandwidth signal ($BW_{FILTERED}$).

In another example, the variable threshold unit 119 can be constructed as an active filter. The active filter can be constructed using active components such as an operation amplifier and a collection of capacitors and resistors as known in the art.

Figure 6:
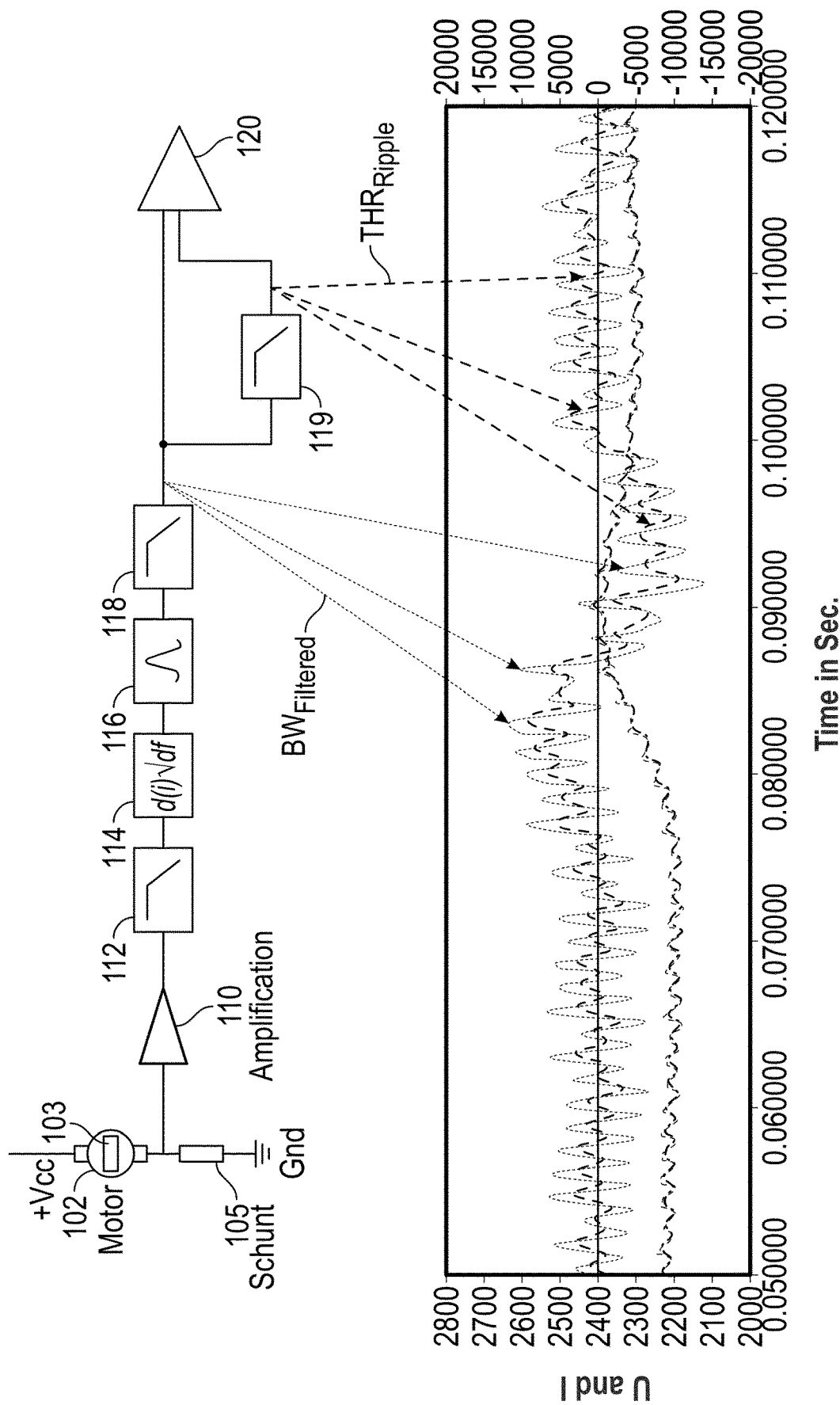
FIG. 6 is a signal diagram illustrating a varying ripple threshold signal output from a variable threshold unit included in the ripple count circuit of FIG. 1.
Figure 8:
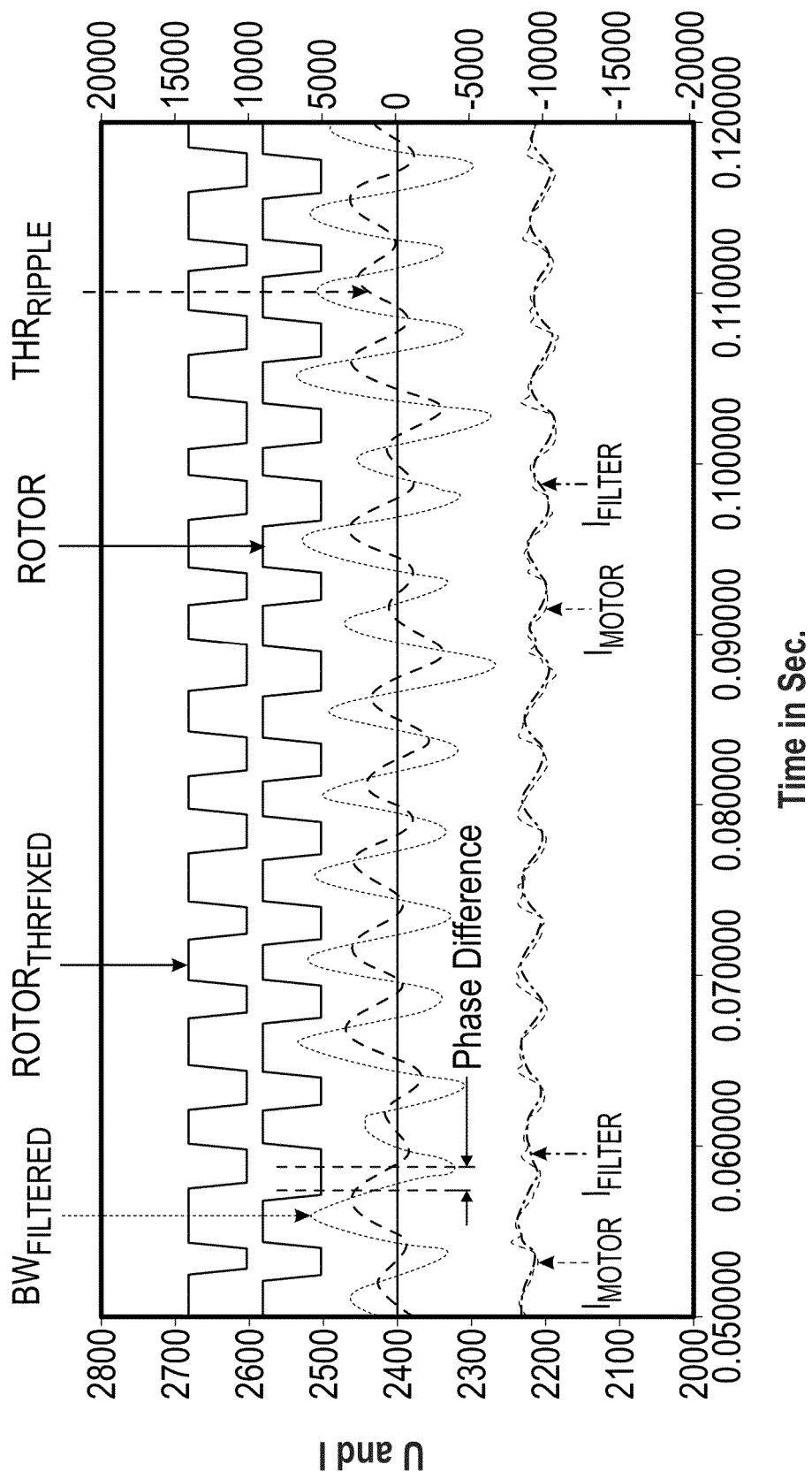
FIG. 8 is a signal diagram illustrating a phase difference between the output signal generated by the downstream low pass filter and the varying ripple threshold signal.

In yet another example, the variable threshold unit 119 can be constructed as low-pass filter. When implemented as a low-pass filter, the frequency cutoff ($f_{C2}$) of the variable threshold unit 119 can be set lower (e.g., three times lower) than the frequency cutoff ($f_C$) of the downstream low pass filter 118. Accordingly the output signal of variable threshold unit 119 (i.e., $THR_{RIPPLE}$) is generated with a lower amplitude, albeit with a phase that is shifted with respect to the input signal (i.e., $BW_{FILTERED}$) creating a phase difference as illustrated in FIG. 8. The frequency cutoff ($f_{C2}$) can be set such that varying ripple threshold ($THR_{RIPPLE}$) follows or tracks the AC bandwidth signal ($BW_{FILTERED}$) without allowing the peak-to-peak amplitude of the AC bandwidth signal ($BW_{FILTERED}$) to drift beyond the range of the varying ripple threshold ($THR_{RIPPLE}$). That is, neither the peak amplitude (i.e., the highest amplitude value) nor the trough amplitude (i.e., the lowest amplitude value) at any given time falls outside the peak amplitude or trough amplitude of the varying ripple threshold ($THR_{RIPPLE}$) as further illustrated in FIG. 6.

Figure 7:
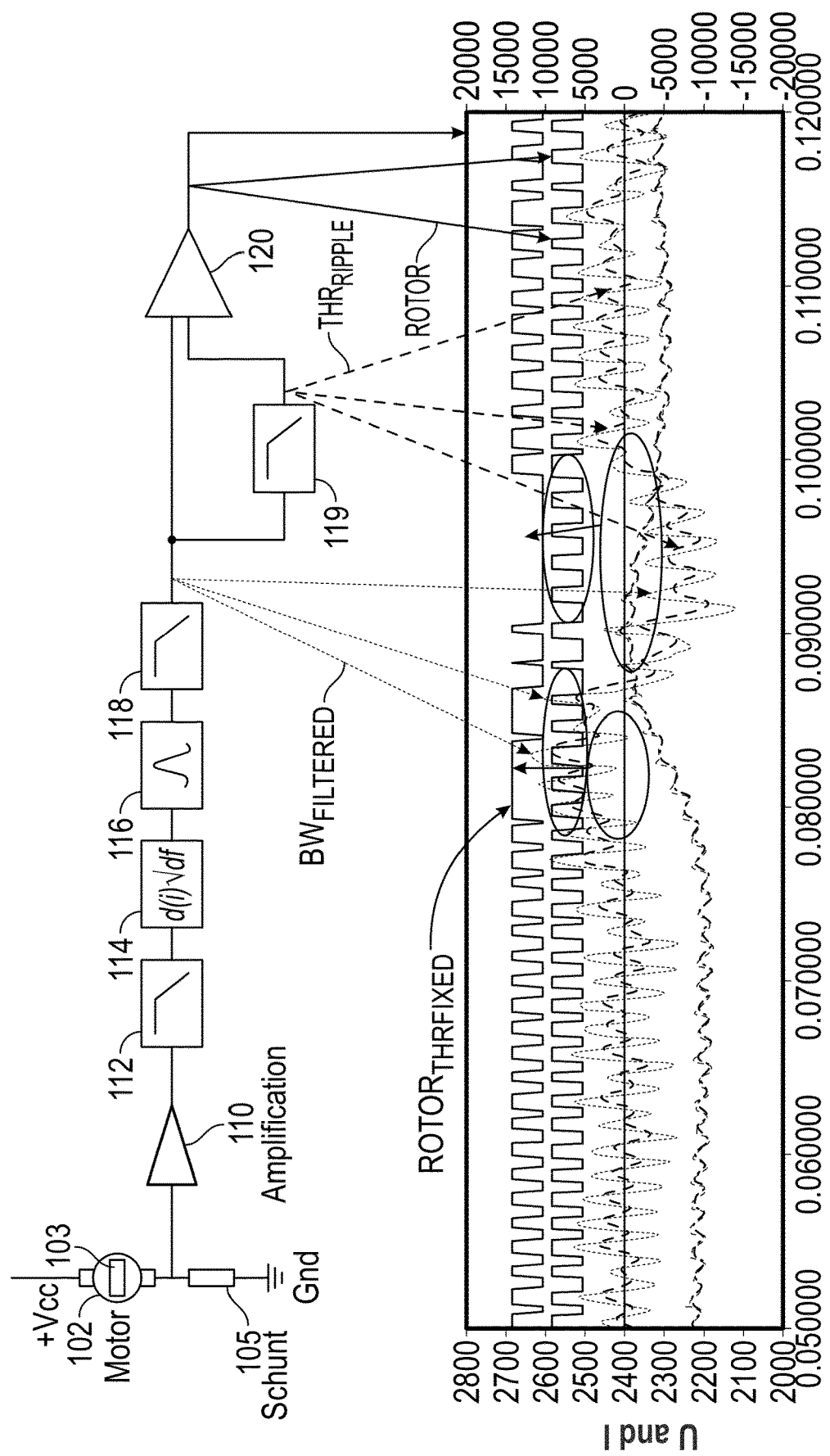
FIG. 7 is a signal diagram illustrating a square wave output according to the varying ripple threshold signal, and indicative of a rotational rotor position (θ) and rotational rotor speed (ω) associated with a motor controlled by the motor control system of FIG. 1 according to a non-limiting embodiment.

The comparator circuit 120 is configured to compare the filtered AC bandwidth signal ($BW_{FILTERED}$) to the varying ripple threshold ($THR_{RIPPLE}$). Based on the comparison, the comparator circuit 120 outputs a pulsed signal or square wave (ROTOR) indicative of the rotational position (θ) and rotational speed (ω) of the rotor 103, as illustrated in FIG. 7. In at least one embodiment, the comparator circuit 120 is constructed as a differential amplifier that includes a pair of input terminals. A first input terminal is connected in common with the input of the variable threshold unit 119 and the output of the downstream low pass filter 118 to receive the filtered AC bandwidth signal ($BW_{FILTERED}$). The second input terminal is connected to the output of the variable threshold unit 119 to receive the varying ripple threshold signal indicative of the varying threshold ($THR_{RIPPLE}$).

The comparator 120 compares the amplitude of the filtered AC bandwidth signal ($BW_{FILTERED}$) to the varying ripple threshold ($THR_{RIPPLE}$). When the difference between $BW_{FILTERED}$ and $THR_{RIPPLE}$ is positive, the comparator 120 generates a first voltage output (e.g., 5 V). When, however, the difference between $BW_{FILTERED}$ and $THR_{RIPPLE}$ is negative, the comparator 120 generates a second voltage output (e.g., 0 V). Accordingly, the comparator circuit 120 outputs the square wave (ROTOR) which indicates the rotational position (θ) and rotational speed (ω) of the rotor 103 without the use of an expensive controller or a combination of a magnetic ring and HES as required by conventional DC motor position systems.

Figure 9:
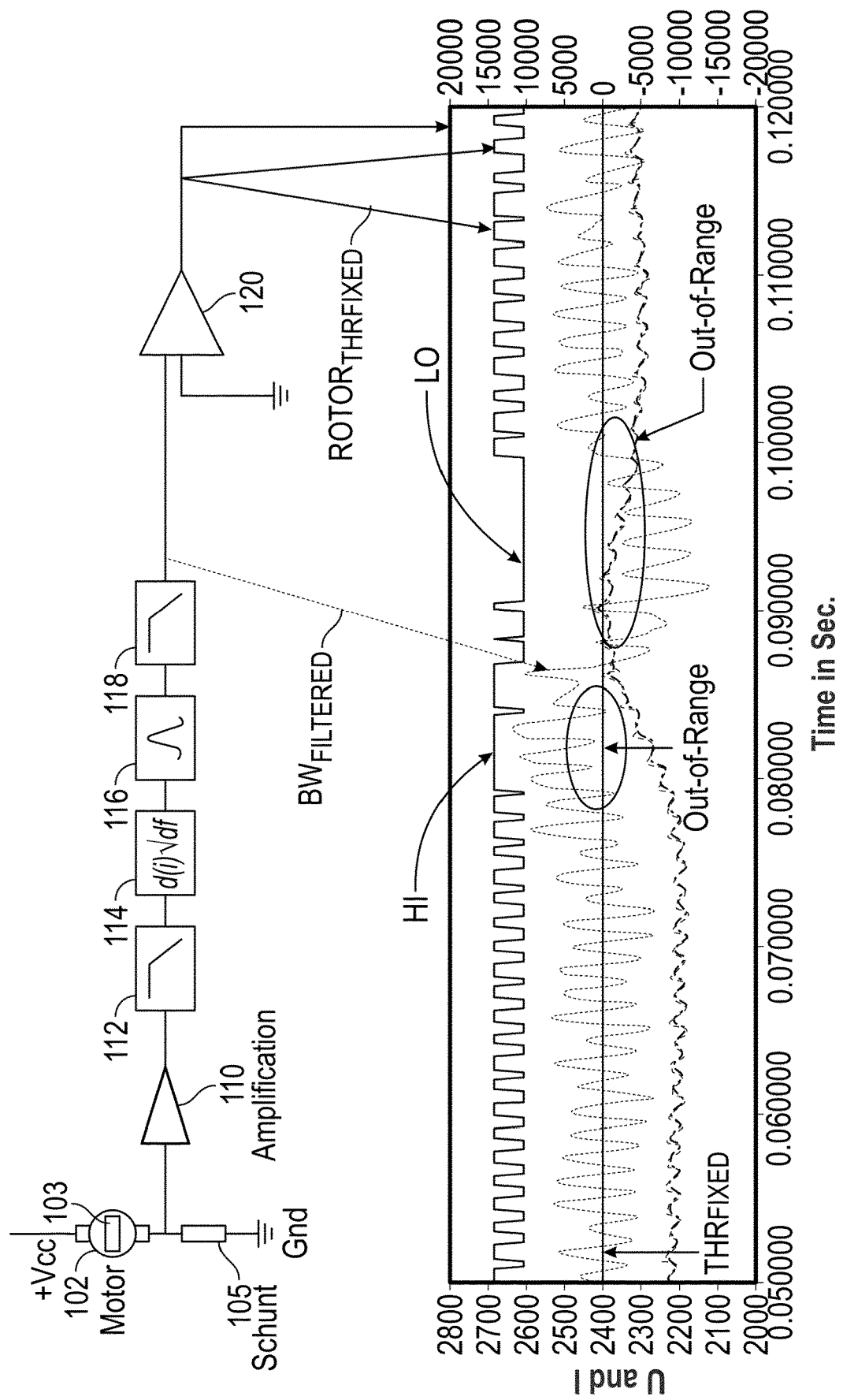
FIG. 9 is a signal diagram illustrating a square wave indicative of a rotational rotor position (θ) and rotational rotor speed (ω), and output according to a fixed ripple threshold.

In addition, comparing the amplitude of the AC bandwidth signal ($BW_{FILTERED}$) to the varying ripple threshold signal ($THR_{RIPPLE}$) as opposed to a fixed threshold improves the accuracy and integrity of the square wave (ROTOR). FIG. 9, for example, illustrates a square wave (ROTOR) generated using a fixed threshold ($THR_{FIX}$) instead of the varying ripple threshold signal ($THR_{RIPPLE}$) described herein. As shown, the fixed threshold ($THR_{FIX}$) is susceptible to signal drifts or out-of-range events where one or more portions of $BW_{FILTERED}$ fall outside of $THR_{FIX}$. As a result, the comparator 120 generates either a sustained HIGH output (HI) or a sustained low output (LO), which introduces inaccuracies into the square wave (ROTOR). The varying ripple threshold signal ($THR_{RIPPLE}$) eliminates the occurrences of these HI or LO events by ensuring that the entire $BW_{FILTERED}$ signal (i.e., every peak amplitude and trough amplitude) remains within the threshold range set by $THR_{RIPPLE}$ (see e.g., FIG. 7). In this manner, the accuracy and integrity of the square wave (ROTOR) is improved when compared to a ripple count circuit that utilizes a fixed threshold.

In at least one embodiment, the square wave (ROTOR) can be delivered to the controller 106 to indicate the rotor position (θ) and rotor speed (ω). Based on the square wave (ROTOR), the controller 106 can adjust the input supply voltage (+Vcc) applied to the motor 102, which in turn varies the motor drive current and thus the mechanical output of the motor 102. In the example described herein, the controller 106 can therefore use the square wave (ROTOR) to vary the drive current, thereby controlling the speed at which to move the position of the glass window 106.

As described herein, various non-limiting embodiments described herein provide a motor control system configured to measure a rotor speed of a DC motor. Unlike conventional DC motor position systems which utilize expensive microcontroller or complex arrangements of a HES and magnetic ring, the motor control system according to at least one embodiment includes a ripple count circuit that extracts the AC ripple current from the motor drive current, and generates a square wave (i.e., ROTOR) indicative of the rotor speed and rotor position. In addition, the variable threshold unit 119 included in the ripple count circuit ensures that the amplitude of the AC bandwidth signal ($BW_{FILTERED}$) remains within the threshold range set by the varying ripple threshold signal ($THR_{RIPPLE}$). In this manner, the accuracy and integrity of the square wave (ROTOR) is improved when compared to a ripple count circuit that utilizes a fixed threshold.

As used herein, the term "module" refers to an application specific integrated circuit (ASIC), an electronic circuit, a microprocessor, a computer processor (shared, dedicated, or group) and memory that executes one or more software or firmware programs, a combinational logic circuit, a microcontroller including various inputs and outputs, and/or other suitable components that provide the described functionality. The module is configured to execute various algorithms, transforms, and/or logical processes to generate one or more signals of controlling a component or system. When implemented in software, a module can be embodied in memory as a non-transitory machine-readable storage medium readable by a processing circuit (e.g., a microprocessor) and storing instructions for execution by the processing circuit for performing a method. A controller refers to an electronic hardware controller including a storage unit capable of storing algorithms, logic or computer executable instruction, and that contains the circuitry necessary to interpret and execute instructions.

As used herein, the terms "first," "second," and the like, herein do not denote any order, quantity, or importance, but rather are used to distinguish one element from another, and the terms "a" and "an" herein do not denote a limitation of quantity, but rather denote the presence of at least one of the referenced item. In addition, it is noted that the terms "bottom" and "top" are used herein, unless otherwise noted, merely for convenience of description, and are not limited to any one position or spatial orientation.

The modifier "about" used in connection with a quantity is inclusive of the stated value and has the meaning dictated by the context (e.g., includes the degree of error associated with measurement of the particular quantity).

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A motor control system comprising:
   a controller configured to generate a variable supply voltage;
   a direct current (DC) motor including a rotor induced to rotate in response to a drive current generated by the variable supply voltage, the rotation of the rotor generating a mechanical force that drives a component; and a ripple count circuit configured to filter the drive current based on a rotational speed ($\omega$) of the rotor to generate at least one filtered drive current signal, wherein the ripple count circuit includes a variable threshold unit configured to generate a varying threshold signal based on the at least one filtered drive current signal, and wherein the ripple count circuit generates a pulsed output signal indicative of the rotational speed ($\omega$) of the rotor and a rotational position ($\theta$) of the rotor based on a comparison between the at least one filtered drive current signal and the varying threshold signal, wherein the ripple count circuit includes a bandwidth filter having variable center frequency ($f_O$) that is actively set according to the rotational speed ($\omega$) of the rotor so as to filter the drive current based on the rotational speed ($\omega$) of the rotor.

2. The motor control system of claim 1, wherein the ripple count circuit compares the at least one filtered drive current signal to the varying threshold signal, outputs the pulsed output signal having a first output voltage level when a voltage level of the at least one filtered drive current is greater than or equal to the varying threshold signal, and outputs the pulsed output signal having a second output voltage level when a voltage level of the at least one filtered drive current is less than varying threshold signal.

3. The motor control system of claim 1, wherein the ripple count circuit includes a downstream low pass filter disposed downstream from the bandwidth filter, the downstream low pass filter configured to eliminate harmonics from the at least one filtered drive current signal.

4. The motor control system of claim 3, wherein the downstream low pass filter has varying frequency cutoff that is actively set according to the rotational speed ($\omega$) of the rotor.

5. The motor control system of claim 1, wherein the controller varies a voltage level of the variable supply voltage based on at least one of the rotational speed ($\omega$) and the rotational position ($\theta$) indicated by the pulsed output signal.

6. A ripple count circuit comprising:

an amplifier configured to amplify a drive current that drives rotation of a rotor included in a direct current (DC) motor;

a current differential circuit configured generate a derivative current signal that indicates an instantaneous rate of current change (d(i)/dt)) of the drive current;

a bandwidth filter configured to filter the derivative current signal based on a rotational speed ($\omega$) of the rotor so as to output a first filtered signal;

a downstream low pass filter configured to filter the first filtered signal based on the rotational speed ($\omega$) of the rotor so as to output a second filtered signal that eliminates harmonics from the first filtered signal;

a variable threshold unit configured to generate a varying threshold signal based on the second filtered signal;

a comparator circuit configured to compare the second filtered signal to the varying threshold, and to generate a pulsed output signal having a first output voltage level when a voltage level of the second filtered signal is greater than or equal to the varying threshold signal, and a second output voltage level when a voltage level of the second filtered signal is less than the varying threshold signal, wherein the pulsed output signal indicates the rotational speed ($\omega$) of the rotor and a rotational position ($\theta$) of the rotor, wherein the bandwidth filter has variable center frequency ($f_O$) that is actively set according to the rotational speed ($\omega$) of the rotor so as to filter the derivative current signal based on the rotational speed ($\omega$) of the rotor.

7. The ripple count circuit of claim 6, wherein the downstream low pass filter filters the first filtered signal according to a varying frequency cutoff that is actively set according to the rotational speed ($\omega$) of the rotor.

8. A method of determining a rotor speed of a direct current (DC) motor, the method comprising:

generating a variable supply voltage;

inducing a drive current based on the variable supply voltage, and rotating a rotor included in the DC motor based on the drive current;

generating a mechanical force in response to rotating the rotor to drive a component;

filtering the drive current based on a rotational speed of the rotor to generate at least one filtered drive current signal;

generating a varying threshold signal based on the at least one filtered drive current signal; and generating a pulsed output signal indicative of the rotational speed ($\omega$) of the rotor and a rotational position ($\theta$) of the rotor based on a comparison between the at least one filtered drive current signal and the varying threshold signal, wherein filtering the drive current comprises performing a first filtering operation on the drive current, the first filtering operating including a bandwidth filtering operation that filters the drive current based on a varying center frequency that is actively set based on the rotational speed ($\omega$) of the rotor.

9. The method of claim 8, wherein generating the pulsed output signal comprises:

outputting the pulsed output signal having a first output voltage level when a voltage level of the at least one filtered drive current is greater than or equal to the varying threshold signal; and outputting the pulsed output signal having a second output voltage level when a voltage level of the at least one filtered drive current is less than the varying threshold signal.

10. The method of claim 8, wherein filtering the drive current further comprises performing a second filtering operation following the first filter operation to eliminate harmonics from the at least one filtered drive current signal.

11. The method of claim 10, wherein the second filtering operation includes performing a low pass filtering operation based on a frequency cutoff that is actively set according to the rotational speed ($\omega$) of the rotor.

12. The method of claim 8, further comprising actively adjusting a voltage level of the variable supply voltage based on at least one of the rotational speed ($\omega$) and the rotational position ($\theta$) indicated by the pulsed output signal.

* * * * *